United States Patent
Yoshikawa

(10) Patent No.: US 12,015,264 B2
(45) Date of Patent: Jun. 18, 2024

(54) POWER CONVERTER

(71) Applicant: Mitsubishi Electric Corporation, Tokyo (JP)

(72) Inventor: Hideki Yoshikawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 185 days.

(21) Appl. No.: 17/850,167

(22) Filed: Jun. 27, 2022

(65) Prior Publication Data

US 2023/0033392 A1 Feb. 2, 2023

(30) Foreign Application Priority Data

Jul. 27, 2021 (JP) ................................. 2021-122106

(51) Int. Cl.
*H02H 7/00* (2006.01)
*H02H 1/00* (2006.01)
*H02H 7/12* (2006.01)

(52) U.S. Cl.
CPC ........ *H02H 7/1213* (2013.01); *H02H 1/0007* (2013.01)

(58) Field of Classification Search
None
See application file for complete search history.

(56) References Cited

U.S. PATENT DOCUMENTS

| | | | | |
|---|---|---|---|---|
| 6,011,416 A * | 1/2000 | Mizuno | ............ | H03K 17/0822 |
| | | | | 327/434 |
| 8,040,650 B2 * | 10/2011 | Ueda | ................. | H03K 17/0822 |
| | | | | 361/93.1 |
| 10,547,301 B1 * | 1/2020 | Oda | .................... | H02M 1/32 |
| 2006/0007620 A1 * | 1/2006 | Ochi | ................... | H02H 9/004 |
| | | | | 361/93.1 |
| 2015/0311779 A1 | 10/2015 | Hayashiguchi et al. | | |

FOREIGN PATENT DOCUMENTS

| | | |
|---|---|---|
| JP | 2002-84173 A | 3/2002 |
| JP | 2002-208847 A | 7/2002 |
| JP | 2020-150791 A | 9/2020 |

OTHER PUBLICATIONS

Communication dated Jul. 12, 2022 from the Japanese Patent Office in Application No. 2021-122106.
Communication dated Sep. 6, 2022 from the Japanese Patent Office in Application No. 2021-122106.

* cited by examiner

*Primary Examiner* — Stephen W Jackson
(74) *Attorney, Agent, or Firm* — Sughrue Mion, PLLC; Richard C. Turner

(57) ABSTRACT

To provide a power converter which can detect occurrence of excess current in early stage without providing a blanking time when the detection of excess current is not performed after the turn on of the switching device, and which can protect the power converter. A power converter includes a time change detection circuit that outputs a detection signal according to a time change rate of a main voltage; an excess current determination circuit that generates an excess current occurrence signal of normal current state when the detection signal is less than a first threshold value, and generates the excess current occurrence signal of excess current state when the detection signal is not less than the first threshold value; and a driving circuit that generates the driving voltage of OFF state when the drive command signal is ON state and the excess current occurrence signal is excess current state.

10 Claims, 8 Drawing Sheets

FIG. 5
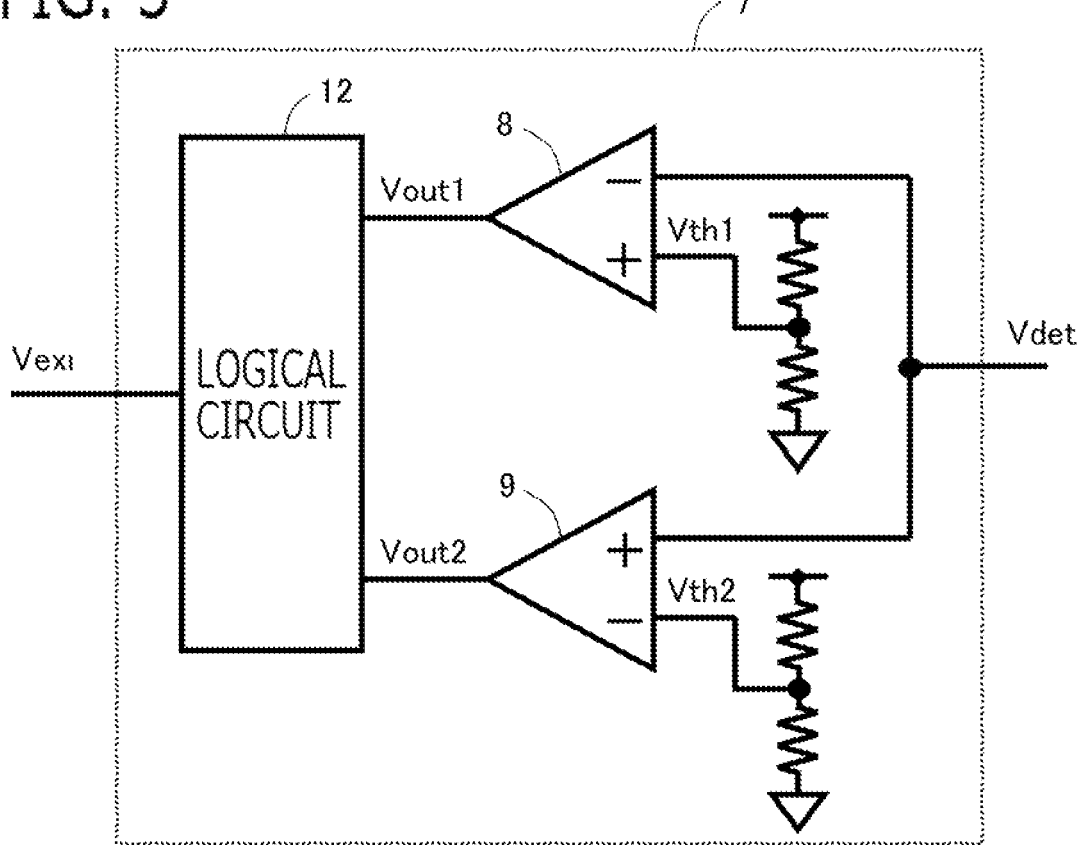
FIG. 6  AT EXCESS CURRENT
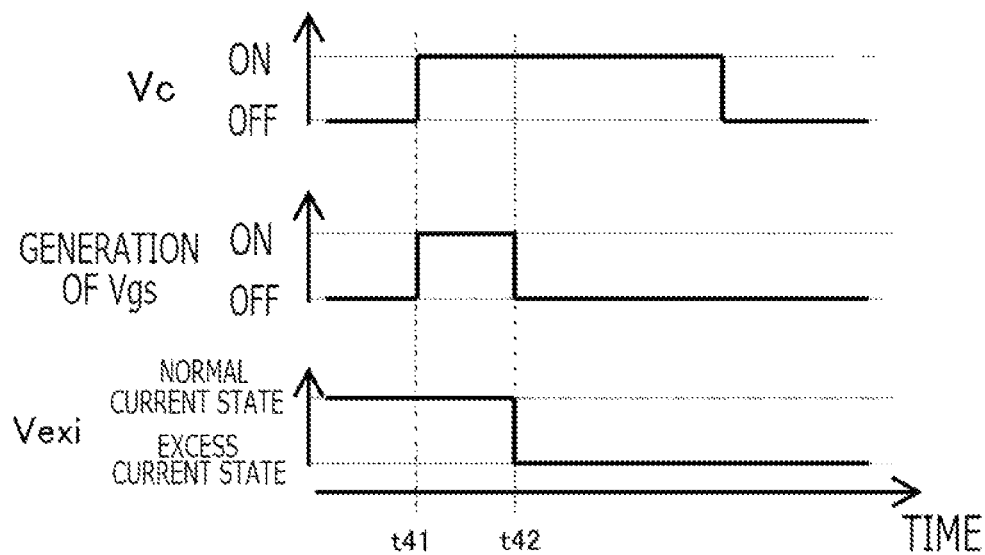

POWER CONVERTER

INCORPORATION BY REFERENCE

The disclosure of Japanese Patent Application No. 2021-122106 filed on Jul. 27, 2021 including its specification, claims and drawings, is incorporated herein by reference in its entirety.

BACKGROUND

The present disclosure relates to a power converter.

The vehicle (hereinafter, referred to as a motorizing vehicle) which mounts an electric powertrain, such as the hybrid vehicle, the plug-in hybrid vehicle, the electric vehicle, and the fuel-cell vehicle, becomes popular these days. These motorizing vehicles mount a motor for driving the wheel, a power converter for driving the motor, and a power converter for charging a high voltage battery or an accessory battery, in addition to the configuration of the conventional gasoline engine vehicle.

Generally, the power converter, such as the inverter and the DC-DC converter, is provided with the excess current protection circuit which detects the excess current which flows into the semiconductor switching device, and stops the ON driving of the semiconductor switching device. This excess current protection circuit plays the role which protects the semiconductor switching device from the excess current. For example, IGBT and MOSFET with a high breakdown voltage are used as the semiconductor switching device.

As the excess current protection circuit, for example, there is a current sense method which performs an excess current detection using a sense current which is outputted from a current detection element (sense terminal) embedded in the semiconductor switching device, and is proportional to a main current of the semiconductor switching device. However, by this method, the current detection element must be embedded in the semiconductor switching device, the cost increases, and an effective area of the semiconductor switching device decreases by embedding the current detection element. Accordingly, it is necessary to enlarge size of the semiconductor switching device, and the cost of the semiconductor switching device increases.

As the excess current protection circuit, there is a DESAT method which detects the excess current by inputting a main voltage between the main electrode terminals of the semiconductor switching device by voltage dividing and the like. In this method, although it is determined whether the main voltage becomes less than or equal to a threshold voltage, a transition time becomes long in the vicinity of 0V of the main voltage. Accordingly, a blanking time which is a period when the detection of excess current is not performed is provided after the turn on of the switching device so that erroneous detection does not be performed. Therefore, compared with the method using the current detection element, a period until the excess current is detected after the turn on becomes long. If the period until the excess current is detected becomes long, the tolerance of the switching device for not causing failure due to the excess current also becomes large, and the cost of the switching device becomes high.

SUMMARY

Then, in JP 2002-208847 A, in order to shorten the period until the excess current is detected and to achieve low cost of the semiconductor switching device in the method detecting the main voltage, a period (a transitional phenomenon interval) until the main voltage between the main electrode terminals become in steady state is shortened, by reducing the gate resistance value during ON transition, as shown in FIG. 2 of JP 2002-208847 A. However, the blanking time (mask period) itself needs to be provided and it does not become drastic shortening of the period until the excess current is detected.

Then, the purpose of the present disclosure is to provide a power converter which can detect occurrence of the excess current in an early stage without providing a blanking time when the detection of excess current is not performed after the turn on of the semiconductor switching device, and which can protect the power converter.

A power converter according to the present disclosure, including:

a semiconductor switching device that is provided with a high potential side main electrode terminal, a low potential side main electrode terminal, and a control electrode terminal, and turns on and off an electrical connection between the high potential side main electrode terminal and the low potential side main electrode terminal according to a voltage applied to the control electrode terminal;

a driving circuit that generates a driving voltage according to an inputted drive command signal, and applies the driving voltage to the control electrode terminal;

a time change detection circuit that is connected between the high potential side main electrode terminal and the low potential side main electrode terminal, and outputs a detection signal according to a time change rate of a main voltage which is a potential difference of the high potential side main electrode terminal with respect to the low potential side main electrode terminal; and an excess current determination circuit that, when the detection signal is less than a first threshold value, determines that a normal current flows between the high potential side main electrode terminal and the low potential side main electrode terminal, and generates an excess current occurrence signal of a normal current state showing occurrence of the normal current; and when the detection signal is not less than the first threshold value, determines that an excess current flows between the high potential side main electrode terminal and the low potential side main electrode terminal, and generates the excess current occurrence signal of an excess current state showing occurrence of the excess current, wherein the driving circuit generates the driving voltage of OFF state, when the excess current occurrence signal is the excess current state, even when the drive command signal is ON state.

In the case of the normal current, after the driving voltage is turned on, the decrease amount of the main voltage becomes large, and the decrease amount of the time change rate of the main voltage becomes large. On the other hand, in the case of the excess current, after the driving voltage is turned on, the decrease amount of the main voltage becomes comparatively small, and the decrease amount of the time change rate of the main voltage becomes comparatively small. According to the power converter of the present disclosure, when the detection signal according to the time change rate of the main voltage is less than the first threshold value, it is determined that the normal current flows. And, when the detection signal is not less than the first threshold value, it is determined that the excess current flows. Accordingly, presence or absence of occurrence of the excess current can be determined with good accuracy.

Then, the driving circuit generates the driving voltage of OFF state, when the excess current occurrence signal outputted from the excess current determination circuit is the excess current state, even when the drive command signal is ON state. Accordingly, occurrence of the excess current can be prevented from continuing and the power converter can be protected.

Since the information on the time change rate of the main voltage is used, when the main voltage is decreasing after the driving voltage is turned on, the determination can be performed. Therefore, unlike conventional, it is not necessary to provide the blanking time and wait for determination until the main voltage is stabilized close to 0V. After the driving voltage is turned on, determination can be performed in an early stage. Accordingly, the occurrence period of excess current can be shortened, the tolerance of the semiconductor switching device which suppresses failure due to the excess current can be reduced, and cost reduction and miniaturization of the semiconductor switching device can be achieved.

BRIEF DESCRIPTION OF THE DRAWINGS

FIG. 5 is a circuit configuration diagram of the excess current decision circuit according to Embodiment 1;

FIG. 6 is a time chart explaining the determination behavior at the time of the excess current according to Embodiment 1;

DETAILED DESCRIPTION OF THE EMBODIMENTS

1. Embodiment 1

Figure 1:
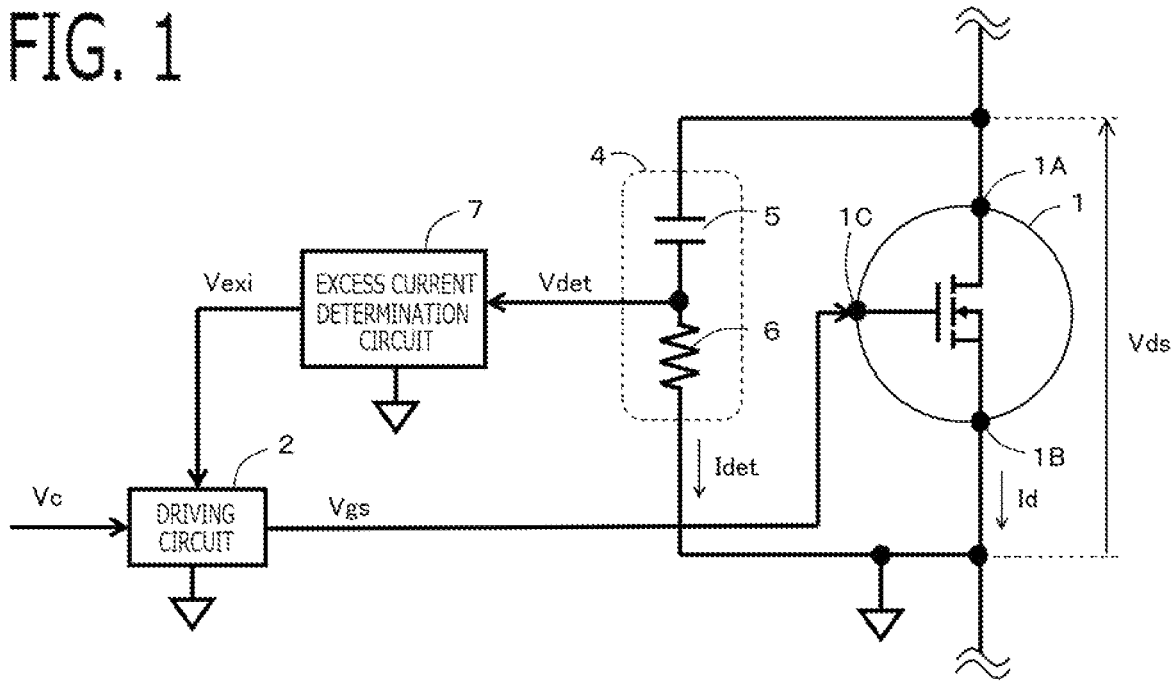
FIG. 1 is a schematic configuration diagram of the power converter according to Embodiment 1.

A power converter according to Embodiment 1 will be explained with reference to drawings. FIG. 1 is a schematic configuration diagram of the power converter according to the present embodiment.

The power converter is provided with a semiconductor switching device 1, a driving circuit 2, a time change detection circuit 4, and an excess current determination circuit 7. In the example of FIG. 1, although 1 pair of the semiconductor switching devices 1 and each circuit 2, 4, 7 are provided, plural pairs of the semiconductor switching device 1 and each circuit may be provided. For example, it may be various kinds of power converter, such as an inverter and a converter, which is provided with plural pairs of the semiconductor switching device 1 and each circuit. Each pair of the semiconductor switching device 1 and each circuit is configured similar to 1 pair of the semiconductor switching device 1 and each circuit explained in the following.

<Semiconductor Switching Device 1>

The semiconductor switching device 1 is provided with a high potential side main electrode terminal 1A, a low potential side main electrode terminal 1B, and a control electrode terminal 1C, and turns on and off an electrical connection between the high potential side main electrode terminal 1A and the low potential side main electrode terminal 1B according to a voltage applied to the control electrode terminal 1C. A high potential voltage, such as a high potential side voltage of a DC power source, is applied to the high potential side main electrode terminal 1A. A low potential voltages, such as a low potential side voltage of the DC power source, is applied to the low potential side main electrode terminal 1B. The low potential side main electrode terminal 1B is connected also with a reference potential of the driving circuit 2, and a reference potential of the excess current determination circuit 7.

In the present embodiment, MOSFET (Metal Oxide Semiconductor Field Effect Transistor) is used as the semiconductor switching device 1. Various kinds of semiconductor switching device, such as IGBT (Insulated Gate Bipolar Transistor), may be used as the semiconductor switching device 1. The high potential side main electrode terminal 1A is a drain terminal 1A, the low potential side main electrode terminal 1B is a source terminal 1B, and the control electrode terminal 1C is a gate terminal 1C.

<Driving Circuit 2>

The driving circuit 2 generates a driving voltage Vgs according to an inputted drive command signal Vc, and applies the driving voltage Vgs to the gate terminal 1C. The drive command signal Vc is inputted into the driving circuit 2 from an unillustrated control apparatus or the like. The driving circuit 2 is a gate driving circuit, for example, insulated type is used. IC (Integrated Circuit) is used for the driving circuit 2.

Basically, the driving circuit 2 generates the driving voltage Vgs of ON state (High voltage), when the drive command signal Vc is ON state (High voltage), and it generates the driving voltage Vgs of OFF state (Low voltage), when the drive command signal Vc is OFF state (Low voltage).

In the present embodiment, the driving circuit 2 generates the driving voltage Vgs of OFF state, when the excess current occurrence signal Vexi outputted from the excess current determination circuit 7 is the excess current state, even when the drive command signal Vc is ON state. That is to say, when the drive command signal Vc is ON state and the excess current occurrence signal Vexi is the normal current state, the driving circuit 2 generates the driving voltage Vgs of ON state. When the drive command signal Vc is ON state and the excess current occurrence signal Vexi is the excess current state, the driving circuit 2 generates the driving voltage Vgs of OFF state. When the drive command signal Vc is OFF state, the driving circuit 2 generates the driving voltage Vgs of OFF state irrespective of whether the excess current occurrence signal Vexi is the normal current state or the excess current state.

<On-Off Behavior of Semiconductor Switching Device>

Figure 2:
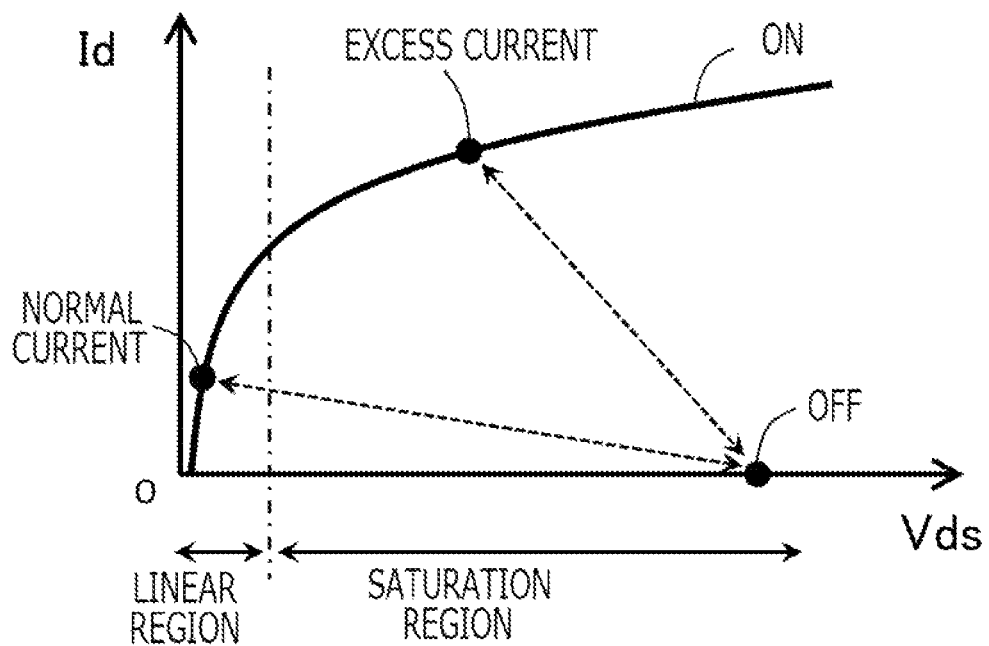
FIG. 2 is a figure showing the relation characteristic between the main voltage of the semiconductor switching device and the main current according to Embodiment 1.
Figure 3:
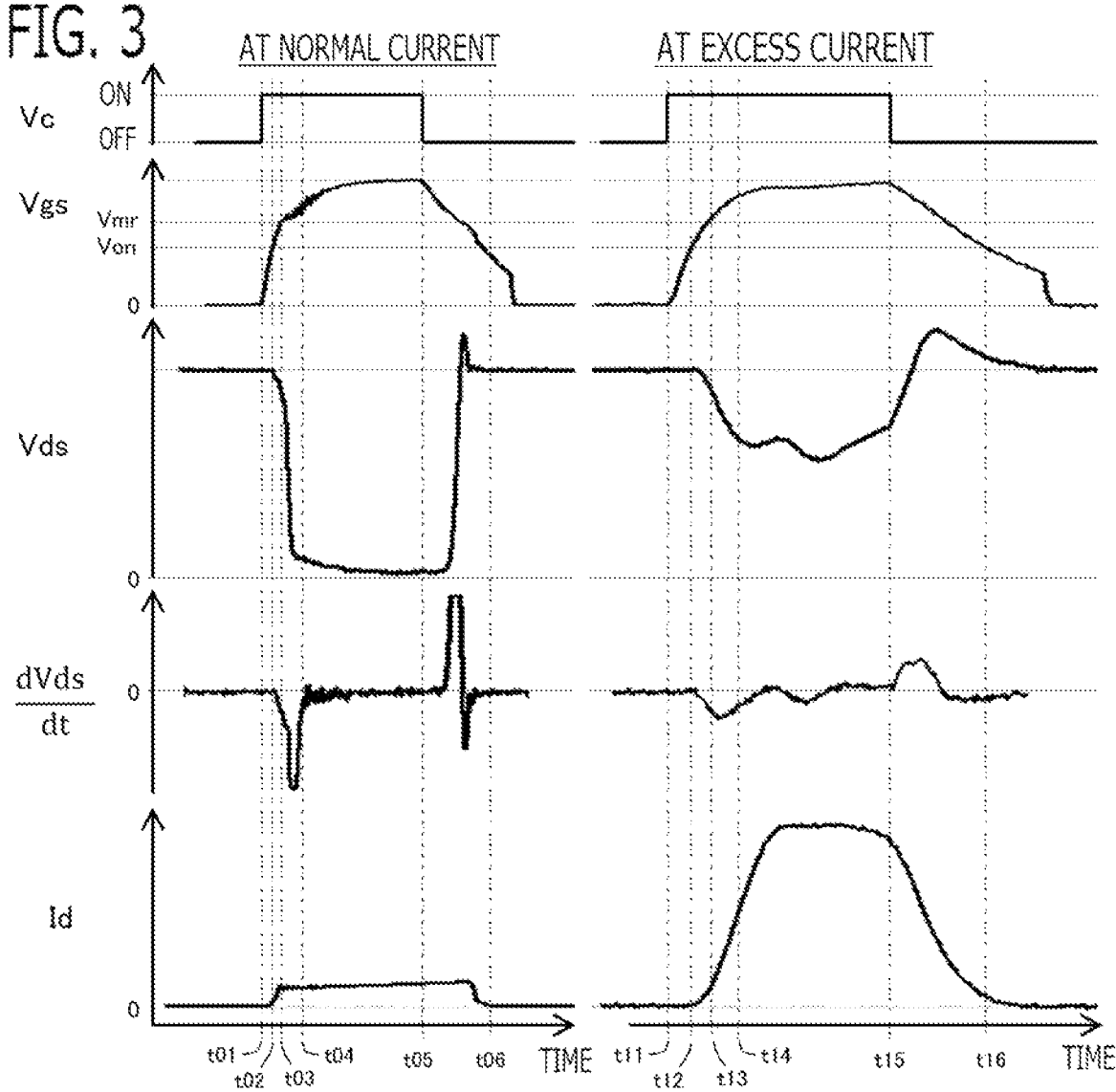
FIG. 3 is a time chart explaining the on-off behavior at the time of the normal current and the excess current according to Embodiment 1.

The on-off behavior of the semiconductor switching device 1 is explained using FIG. 2 and FIG. 3. FIG. 2 shows a relation characteristic between a main current Id which flows between the drain terminal 1A and the source terminal 1B when the semiconductor switching device 1 is turned on, and a main voltage Vds which is a potential difference between the drain terminal 1A and the source terminal 1B. As the main current Id increases, a voltage drop between the main electrode terminals increases, and the main voltage Vds increases. A region where the main current Id is low is a linear region, and the main voltage Vds increases approximately in proportion to the increase in the main current Id. On the other hand, a region where the main current Id is high is a saturation region, and an increase amount of the main voltage Vds (voltage drop amount) increases with respect to an increase amount of the main current Id.

FIG. 2 shows an example of an operating point of the normal current, and an example of an operating point of the excess current. For example, if an electric load is connected between the drain terminal 1A and the high potential side terminal of the DC power source, when the semiconductor switching device 1 is turned on in a state where the drain terminal 1A and the high potential side terminal of the DC power source are short-circuited for some reason, the excess current flows. On the other hand, if the electric load is connected between the source terminal 1B and the low potential side terminal of the DC power source, when the semiconductor switching device 1 is turned on in a state where the source terminal 1B and the low potential side terminal of the DC power source are short-circuited for some reason, the excess current flows.

When the semiconductor switching device 1 is turned off, the main current Id is 0A, and the main voltage Vds becomes a potential difference between a voltage applied to the drain terminal 1A, and a voltage applied to the source terminal 1B. Then, between ON state and OFF state is changed by turning on and off the driving voltage Vgs.

The left side of FIG. 3 shows the on-off behavior of the semiconductor switching device 1 when the normal current flows. At the time t01, the drive command signal Vc becomes ON state from OFF state, and the driving circuit 2 starts generation of the driving voltage Vgs of ON state. After that, the driving voltage Vgs increases gradually. When the driving voltage Vgs reaches the ON voltage Von at the time t02, the conduction between the main electrode terminals starts, the main current Id starts to increase, and the main voltage Vds starts to decrease.

At the time t03, charge of the mirror capacity between the drain terminal 1A and the gate terminal 1C starts. When charge of the mirror capacity on the drain terminal side starts, the increasing speed of the driving voltage Vgs decreases. During the mirror capacity on the drain terminal side is charged, the main voltage Vds decreases rapidly, when charge of the mirror capacity on the drain terminal side is completed, the decreasing speed of the main voltage Vds becomes slow (time t04). After charge of the mirror capacity on the drain terminal side is completed, the driving voltage Vgs increases to a prescribed power source voltage. The driving voltage Vgs when charge of the mirror capacity on the drain terminal side starts at the time t03 is referred to as a miller voltage Vmr.

In this way, after the driving voltage Vgs reaches the miller voltage Vmr, the main voltage Vds starts to decrease largely. In the case of the normal current, it operates in the linear region as shown in FIG. 2, and the main voltage Vds decreases close to 0V. Since the decrease amount of the main voltage Vds is large, the decreasing speed of the main voltage Vds becomes large, and the decrease amount of the time change rate dVds/dt of the main voltage Vds becomes large. In this way, in the case of the normal current, there is a feature that the decrease amount of the time change rate dVds/dt of the main voltage Vds when the semiconductor switching device 1 is turned on becomes large.

On the other hand, at the time t05, the drive command signal Vc becomes OFF state from ON state, and the driving circuit 2 starts generation of the driving voltage Vgs of OFF state. Although detailed explanation is omitted, after that, the driving voltage Vgs decreases. At the time t06, when the driving voltage Vgs becomes less than the ON voltage Von, between the main electrode terminals becomes non-conductive, and the main current Id decreases to zero.

Next, the right side of FIG. 3 shows the on-off behavior of the semiconductor switching device 1 when the excess current flows. Although the principle of turning on and off is similar to the case of the normal current, since the main current Id becomes excessive, the waveform is deformed. At the time t11, the drive command signal Vc becomes ON state from OFF state, and the driving circuit 2 starts generation of the driving voltage Vgs of ON state. After that, the driving voltage Vgs increases gradually. When the driving voltage Vgs reaches the ON voltage Von at the time t12, the conduction between the main electrode terminals starts, the main current Id starts to increase, and the main voltage Vds starts to decrease.

At the time t13, charge of the mirror capacity on the drain terminal side starts. After charge of the mirror capacity on the drain terminal side is completed, the driving voltage Vgs increases to the prescribed power source voltage (after the time t14).

Also in the case of the excess current, after the driving voltage Vgs reaches the miller voltage Vmr, the main voltage Vds starts to decrease largely. In the case of the excess current, it operates in the saturation region as shown in FIG. 2, and the main voltage Vds does not decrease close to 0V. Since the decrease amount of the main voltage Vds is small, the decreasing speed of the main voltage Vds becomes comparatively small, and the decrease amount of the time change rate dVds/dt of the main voltage Vds becomes comparatively small. In this way, in the case of the excess current, there is a feature that the decrease amount of the time change rate dVds/dt of the main voltage Vds when the semiconductor switching device 1 is turned on becomes comparatively small.

On the other hand, at the time t15, the drive command signal Vc becomes OFF state from ON state, and the driving circuit 2 starts generation of the driving voltage Vgs of OFF state. After that, the driving voltage Vgs decreases. When the driving voltage Vgs becomes less than the ON voltage Von at the time t16, between the main electrode terminals becomes non-conductive, and the main current Id decreases to zero.

<Time Change Detection Circuit 4>

As explained above, in the case of the normal current, the decrease amount of the time change rate dVds/dt of the main voltage Vds when the semiconductor switching device 1 is turned on becomes large. In the case of the excess current, the decrease amount of the time change rate dVds/dt of the main voltage Vds when the semiconductor switching device 1 is turned on becomes small. Accordingly, by monitoring behavior of the time change rate dVds/dt of the main voltage Vds, it can be detected that either of the normal current or the excess current occurs.

Then, the power converter is provided with the time change detection circuit 4. The time change detection circuit 4 is connected between the drain terminal 1A and the source terminal 1B, and outputs a detection signal Vdet according to a time change rate dVds/dt of the main voltage Vds which is a potential difference of the drain terminal 1A with respect to the source terminal 1B.

The time change detection circuit 4 is provided with a differentiation circuit which outputs the detection signal Vdet obtained by time-differentiating the main voltage Vds. The differentiation circuit is configured by a capacity element 5 and a resistance element 6 which were connected in series between the drain terminal 1A and the source terminal 1B. In the present embodiment, a capacitor is used as the capacity element 5. One end of the capacity element 5 is connected to the drain terminal 1A, the other end of the capacity element 5 is connected to one end of the resistance element 6, and the other end of the resistance element 6 is connected to the source terminal 1B. The connection node between the capacity element 5 and the resistance element 6 is connected to the excess current determination circuit 7, and a potential of the connection node is outputted to the excess current determination circuit 7 as the detection signal Vdet.

According to change of the main voltage Vds between the drain terminal 1A and the source terminal 1B, a current Idet (referred to as a detection current Idet) flows into the capacity element 5 and the resistance element 6. The direction of the detection current Idet of FIG. 1 shows a direction of current when the main voltage Vds increases. The detection current Idet becomes like the next equation with the time change rate dVds/dt of the main voltage Vds, and the capacity C of the capacity element 5.

$$Idet = C \times dVds/dt \qquad (1)$$

Then, the detection signal Vdet which is the potential of the connection node between the capacity element 5 and the resistance element 6 becomes like the next equation according to the resistance R of the resistance element 6 and the detection current Idet.

$$Vdet = R \times Idet \qquad (2)$$

Figure 13:
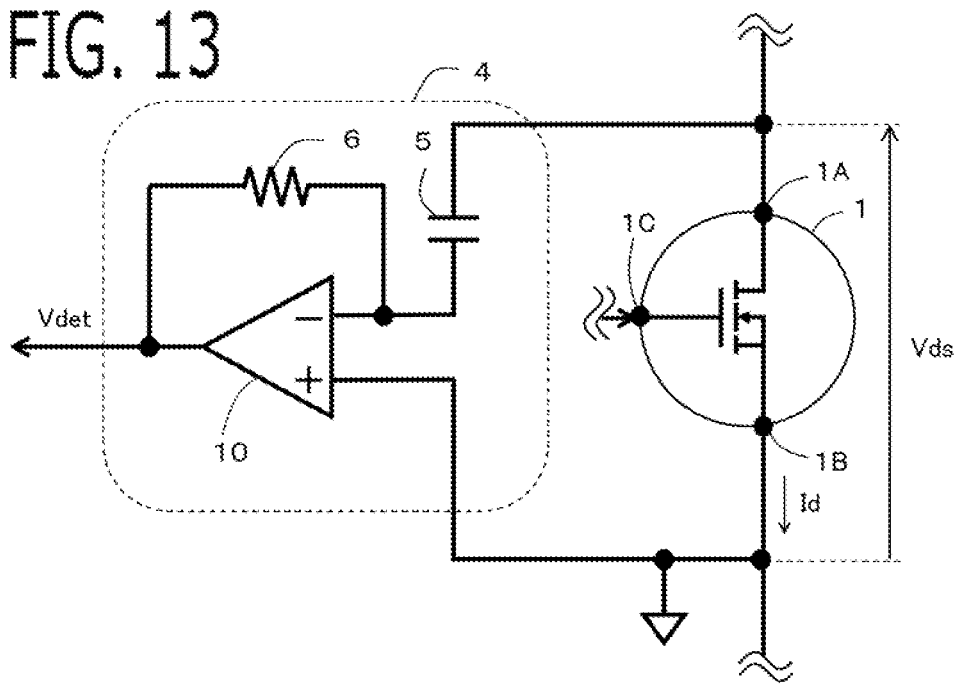
FIG. 13 is a circuit configuration diagram of the time change detection circuit according to other embodiment.

Other types of circuit may be used as the time change detection circuit 4. For example, as shown in FIG. 13, the differentiation circuit may be configured by a capacity element 5, a resistance element 6, and an operational amplifier 10, or, it may be configured by IC or digital circuit which has a differentiation function.

<Excess Current Determination Circuit 7>

When the detection signal Vdet is less than a first threshold value Vth1, the excess current determination circuit 7 determines that the normal current flows between the drain terminal 1A and the source terminal 1B, and generates an excess current occurrence signal Vexi of a normal current state showing occurrence of the normal current. When the detection signal Vdet is not less than the first threshold value Vth1, the excess current determination circuit 7 determines that the excess current flows between the drain terminal 1A and the source terminal 1B, and generates the excess current occurrence signal Vexi of an excess current state showing occurrence of the excess current. The excess current determination circuit 7 performs the determination, when the driving voltage Vgs is ON state.

As explained using FIG. 3, in the case of the normal current, after the driving voltage Vgs is turned on, the decrease amount of the main voltage Vds becomes large, and the decrease amount of the time change rate dVds/dt of the main voltage becomes large. On the other hand, in the case of the excess current, after the driving voltage Vgs is turned on, the decrease amount of the main voltage Vds becomes comparatively small, and the decrease amount of the time change rate dVds/dt of the main voltage becomes comparatively small. According to the above configuration, when the detection signal Vdet according to the time change rate dVds/dt of the main voltage is less than a first threshold value Vth1, it is determined that the normal current flows, and when the detection signal Vdet is not less than the first threshold value Vth1, it is determined that the excess current flows. Accordingly, the presence or absence of occurrence of the excess current can be determined with good accuracy.

Then, the driving circuit 2 generates the driving voltage Vgs of OFF state, when the excess current occurrence signal Vexi outputted from the excess current determination circuit 7 is the excess current state, even when the drive command signal Vc is ON state. Accordingly, occurrence of the excess current can be prevented from continuing and the power converter can be protected.

Since the information on the time change rate dVds/dt of the main voltage is used, the determination can be performed, when the main voltage Vds is decreasing after the driving voltage Vgs is turned on. Therefore, unlike conventional, it is not necessary to provide a blanking time and wait for determination until the main voltage Vds is stabilized close to 0V. After the driving voltage Vgs is turned on, determination can be performed in an early stage. Accordingly, the occurrence period of excess current can be shortened, the tolerance of the semiconductor switching device which suppresses failure due to the excess current can be reduced, and cost reduction and miniaturization of the semiconductor switching device can be achieved.

In the present embodiment, the excess current occurrence signal Vexi of the excess current state showing occurrence of the excess current is Low voltage (for example, 0V), and the excess current occurrence signal Vexi of the normal current state showing occurrence of the normal current is High voltage (for example, 5V). The excess current occurrence signal Vexi of the excess current state may be High voltage, and the excess current occurrence signal Vexi of the normal current state may be Low voltage. The excess current occurrence signals Vexi may be any signals showing the excess current state showing occurrence of the excess current, and the normal current state showing occurrence of the normal current, for example, it may be a digital signal.

In the present embodiment, when, after the detection signal Vdet becomes less than a second threshold value Vth2 which is a value higher than the first threshold value Vth1, the detection signal Vdet exceeds the second threshold value Vth2 without being less than the first threshold value Vth1, the excess current determination circuit 7 determines that excess current flows, and generates the excess current occurrence signal Vexi of the excess current state. On the other hand, when, in a state where the detection signal Vdet is less than the second threshold value Vth2, the detection signal Vdet becomes less than the first threshold value Vth1, the excess current determination circuit 7 determines that the normal current flows, and generates the excess current occurrence signal Vexi of the normal current state. In the present embodiment, as shown in the next equation, the second threshold value Vth2 is smaller than zero, and the first threshold value Vth1 is smaller than the second threshold value Vth2. The first threshold value Vth1 and the second threshold value Vth2 are preliminarily set so that the excess current or the normal current can be determined appropriately.

$$Vth1 < Vth2 < 0 \tag{3}$$

Figure 4:
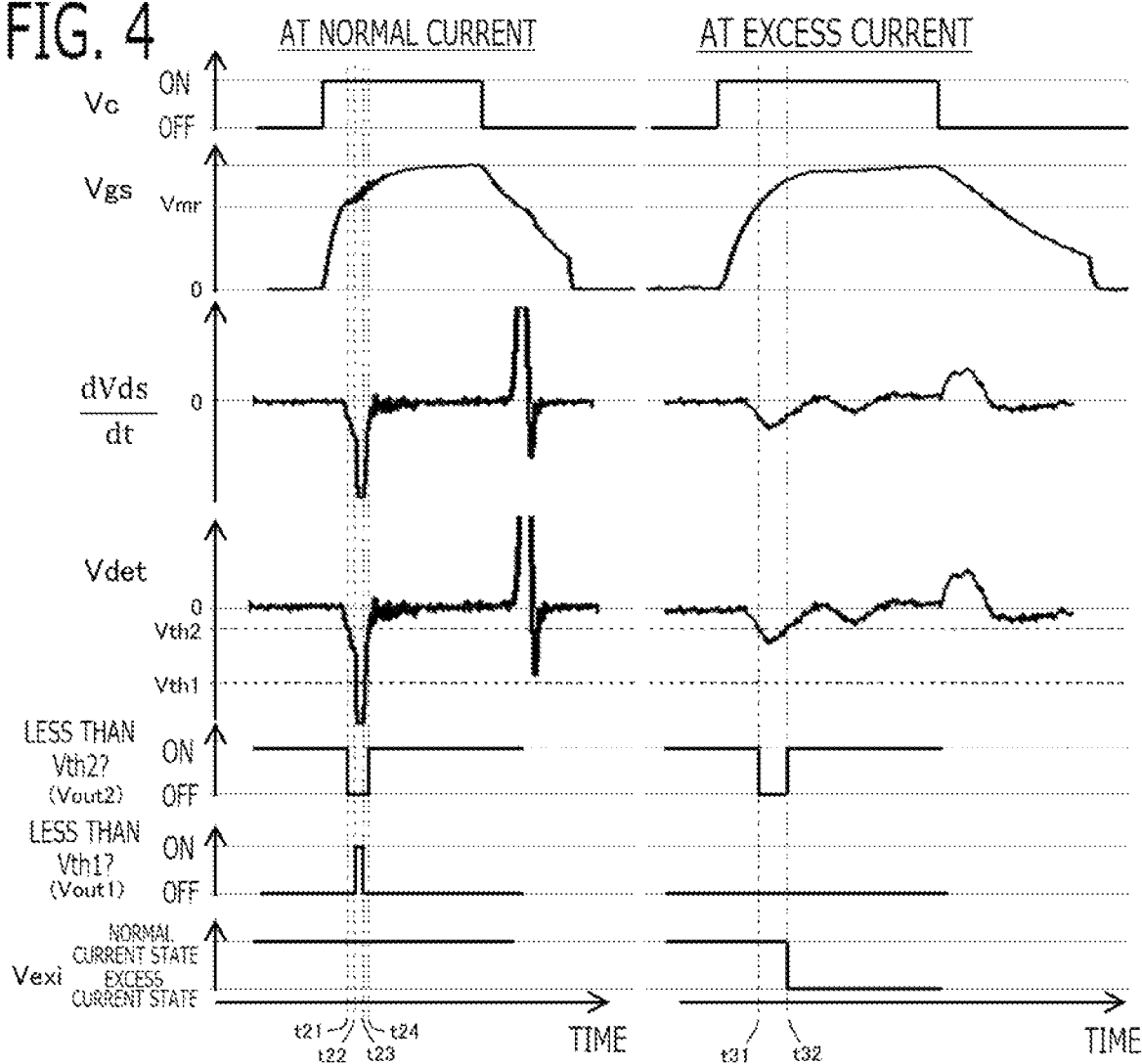
FIG. 4 is a time chart explaining the determination behavior at the time of the normal current and the excess current according to Embodiment 1.

According to this configuration, as the left side of FIG. 4 shows the determination behavior at the time of the normal current corresponding to the left side of FIG. 3, and the right side of FIG. 4 shows the determination behavior at the time of the excess current corresponding to the right side of FIG. 3, at both times of the normal current and the excess current, when the driving voltage Vgs becomes ON state, the conduction between the main electrode terminals starts, and the main voltage Vds decreases, the detection signal Vdet according to the time change rate of the main voltage Vds changes to the negative direction, and becomes less than the second threshold value Vth2. After that, when the decrease amount of the main voltage Vds is stabilized, the change amount to the negative direction of the detection signal Vdet decreases, and the detection signal Vdet exceeds the second threshold value Vth2. That is, when the detection signal Vdet is less than the second threshold value Vth2, it is in the state where the main voltage Vds decreased just after the driving voltage Vgs became ON state.

As shown in the right side of FIG. 4, when the excess current flows, the voltage drop between the main electrode terminals becomes large, the decrease amount of the main voltage Vds becomes comparatively small, and the change amount to the negative direction of the detection signal Vdet becomes comparatively small. On the other hand, when the normal current flows, the voltage drop between the main electrode terminals becomes small, the decrease amount of the main voltage Vds becomes comparatively large, and the change amount to the negative direction of the detection signal Vdet becomes comparatively large. Therefore, when, after the detection signal Vdet becomes less than the second threshold value Vth2 (time t31), the detection signal Vdet exceeds the second threshold value Vth2 (time t32) without being less than the first threshold value Vth1, it can be determined with good accuracy that the excess current flows.

On the other hand, as shown in the left side of FIG. 4, when, in a state where the detection signal Vdet is less than second threshold value Vth2, the detection signal Vdet becomes less than the first threshold value Vth1 (time t22), it can be determined with good accuracy that the normal current flows.

The determination of the normal current and the abnormal current is performed in a state where the main voltage Vds is changing just after the driving voltage Vgs is turned on. Accordingly, occurrence of the excess current is determined in an early stage just after the driving voltage Vgs is turned on, the excess current occurrence signal Vexi of the excess current state is outputted to the driving circuit, the driving voltage Vgs is made into OFF state, and occurrence of the excess current can be prevented from continuing. Therefore, the power converter can be protected in an early stage at the time of occurrence of the excess current.

FIG. 4 is a figure for explaining the determination behavior, after the excess current occurrence signal Vexi becomes the excess current state, the driving voltage Vgs is not immediately changed from ON state to OFF state. However, as described later, actually, after the excess current occurrence signal Vexi becomes the excess current state, the driving circuit 2 changes the driving voltage Vgs from ON state to OFF state immediately.

In order to prepare for the next on/off control of the semiconductor switching device, when the drive command signal Vc becomes OFF state from ON state, or when the drive command signal Vc becomes ON state from OFF state, the excess current determination circuit 7 may reset the excess current occurrence signal Vexi to the normal current state. When the short circuit abnormality of load occurs, although the excess current occurs whenever the drive command signal Vc is turned on, since it can be suppressed in a short time, the power converter can be protected. A control apparatus which generates the drive command signal Vc may determine the short circuit abnormality of load during its period by a well-known method, stop the on/off control of the semiconductor switching device, and does not change the drive command signal Vc to ON state.

<Circuit Configuration>

FIG. 5 shows an example of the circuit configuration of the excess current determination circuit 7. The excess current determination circuit 7 is provided with a first comparator 8, a second comparator 9, and a logical circuit 12. A comparator is used for the first comparator 8 and the second comparator 9. A first potential Vth1 corresponding to the first threshold value Vth1 is inputted into a non-inversed input terminal (+) of the first comparator 8, and the detection signal Vdet is inputted into an inversed input terminal (−) of the first comparator 8. The first potential Vth1 is generated by voltage dividing resistances and the like. An output signal Vout1 of the first comparator 8 becomes ON state (High voltage) when the detection signal Vdet is less than the first potential Vth1, and the output signal Vout1 of the first comparator 8 becomes OFF state (Low voltage) when the detection signal Vdet exceeds the first potential Vth1. The output signal Vout1 of the first comparator 8 is inputted into the logic circuit 12.

The detection signal Vdet is inputted into a non-inversed input terminal (+) of the second comparator 9, and a second potential Vth2 corresponding to the second threshold value Vth2 is inputted into an inversed input terminal (−) of the second comparator 9. The second potential Vth2 is generated by voltage dividing resistances and the like. An output signal Vout2 of the second comparator 9 becomes OFF state (Low voltage) when the detection signal Vdet is less than second potential Vth2, and the output signal Vout2 of the second comparator 9 becomes ON state (High voltage) when the detection signal Vdet exceeds the second potential Vth2. The output signal Vout2 of the second comparator 9 is inputted into the logic circuit 12.

When, in a state where the output signal Vout2 of the second comparator 9 is OFF state (Low voltage), the output signal Vout1 of the first comparator 8 changes from OFF state (Low voltage) to ON state (High voltage), the logic circuit 12 sets the excess current occurrence signal Vexi which is an output signal of the logic circuit 12 to the normal current state (High voltage) showing occurrence of the normal current. On the other hand, when, after the output signal Vout2 of the second comparator 9 becomes OFF state (Low voltage), the output signal Vout2 of the second comparator 9 become ON state (High voltage) while the output signal Vout1 of the first comparator 8 is OFF state (Low voltage), the logic circuit 12 sets the output signal Vexi of the logic circuit 12 to the excess current state (Low voltage) showing occurrence of the excess current.

Other types of circuit may be used as the excess current determination circuit 7. For example, it may be configured by an IC, a digital circuit, and the like.

<Driving Circuit 2 at Excess Current Determination>

As mentioned above, the driving circuit 2 generates the driving voltage Vgs of OFF state, when the excess current occurrence signal Vexi outputted from the excess current determination circuit 7 is the excess current state (Low voltage), even when the drive command signal Vc is ON state. On the other hand, when the drive command signal Vc is ON state and the excess current occurrence signal Vexi is the normal current state (High voltage), the driving circuit 2 generates the driving voltage Vgs of ON state. When the drive command signal Vc is OFF state, the driving circuit 2 generates the driving voltage Vgs of OFF state irrespective of whether the excess current occurrence signal Vexi is the normal current state or the excess current state.

In the present embodiment, when the drive command signal Vc is ON state and the excess current occurrence signal Vexi is the normal current state, the driving circuit 2 generates the driving voltage Vgs of ON state. When the drive command signal Vc is ON state and the excess current occurrence signal Vexi is the excess current state, the driving circuit 2 generates the driving voltage Vgs of OFF state. As FIG. 6 shows the behavior at the time of the excess current, at the time t41, since the excess current occurrence signal Vexi is the normal current state when the drive command signal Vc becomes ON state, the driving circuit 2 starts generation of the driving voltage Vgs of ON state. Just after it, at the time t42, the excess current determination circuit 7 determines that the excess current occurred, and changes the excess current occurrence signal Vexi from the normal current state to the excess current state. Then, at the time t42, since the excess current occurrence signal Vexi became the excess current state, the driving circuit 2 changes the driving voltage Vgs from ON state to OFF state. In this way, occurrence of the excess current is determined in an early stage just after the driving voltage Vgs becomes ON state, and the driving voltage Vgs is changed from ON state to OFF state at the time when the excess current is determined. Accordingly, occurrence of the excess current can be prevented from continuing. Therefore, the power converter can be protected in an early stage at the occurrence of the excess current.

The driving circuit 2 may reflect the determination result of the excess current at the subsequent on/off control of the semiconductor switching device 1.

Figure 7:
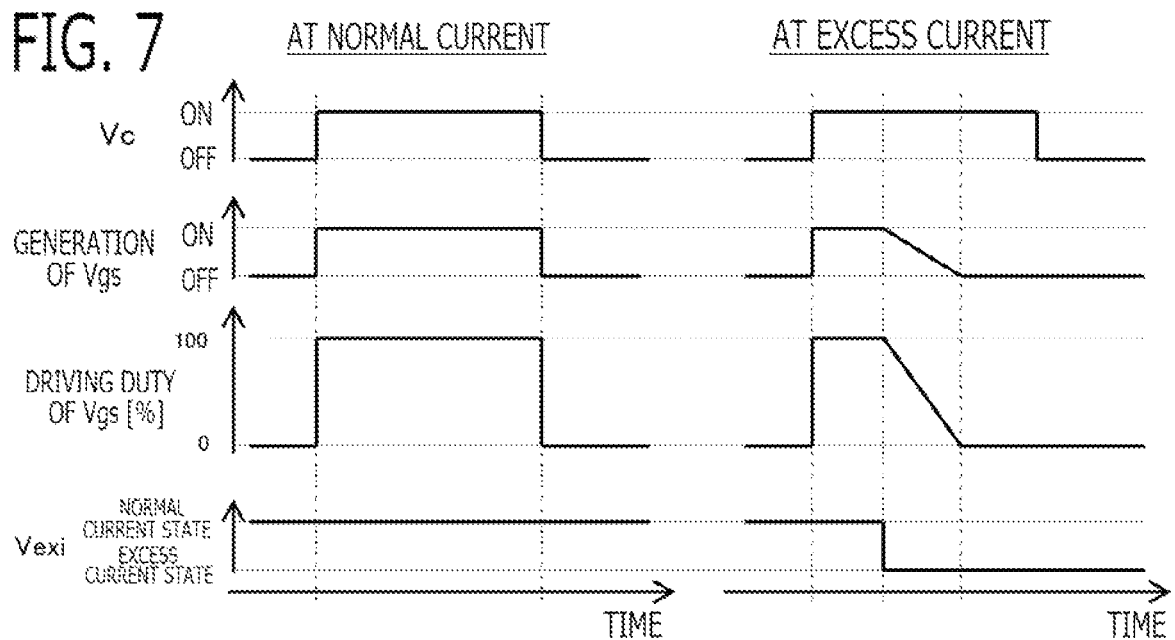
FIG. 7 is a time chart explaining the determination behavior at the time of the normal current and the excess current according to Embodiment 1.

As shown in FIG. 7, the driving circuit 2 may make a change speed of changing the driving voltage Vgs from ON state to OFF state when the excess current occurrence signal Vexi becomes the excess current state slower than a change speed when the excess current occurrence signal Vexi is the normal current state. For example, the driving circuit 2 is provided with a switching device which switches ON state and OFF state of the driving voltage Vgs. About a change speed which changes a duty of PWM control of the switching device from 100% to 0% (from 0% to or 100%), a change speed when the excess current occurrence signal Vexi is the excess current state is made slower than a change speed when the excess current occurrence signal Vexi is the normal current state. For example, when the excess current occurrence signal is the normal current state, the duty of the switching device may be changed from 100% to 0% stepwise. When the excess current occurrence signal becomes the excess current state, the duty of the switching device may be gradually changed from 100% to 0%.

By making slow the change speed which changes the driving voltage Vgs from ON state to OFF state at the excess current occurrence, a surge voltage of the main voltage Vds which is generated when the excess current is turned off can be suppressed, and the power converter can be protected.

<First Other Embodiment of Excess Current Determination Circuit 7>

Figure 8:
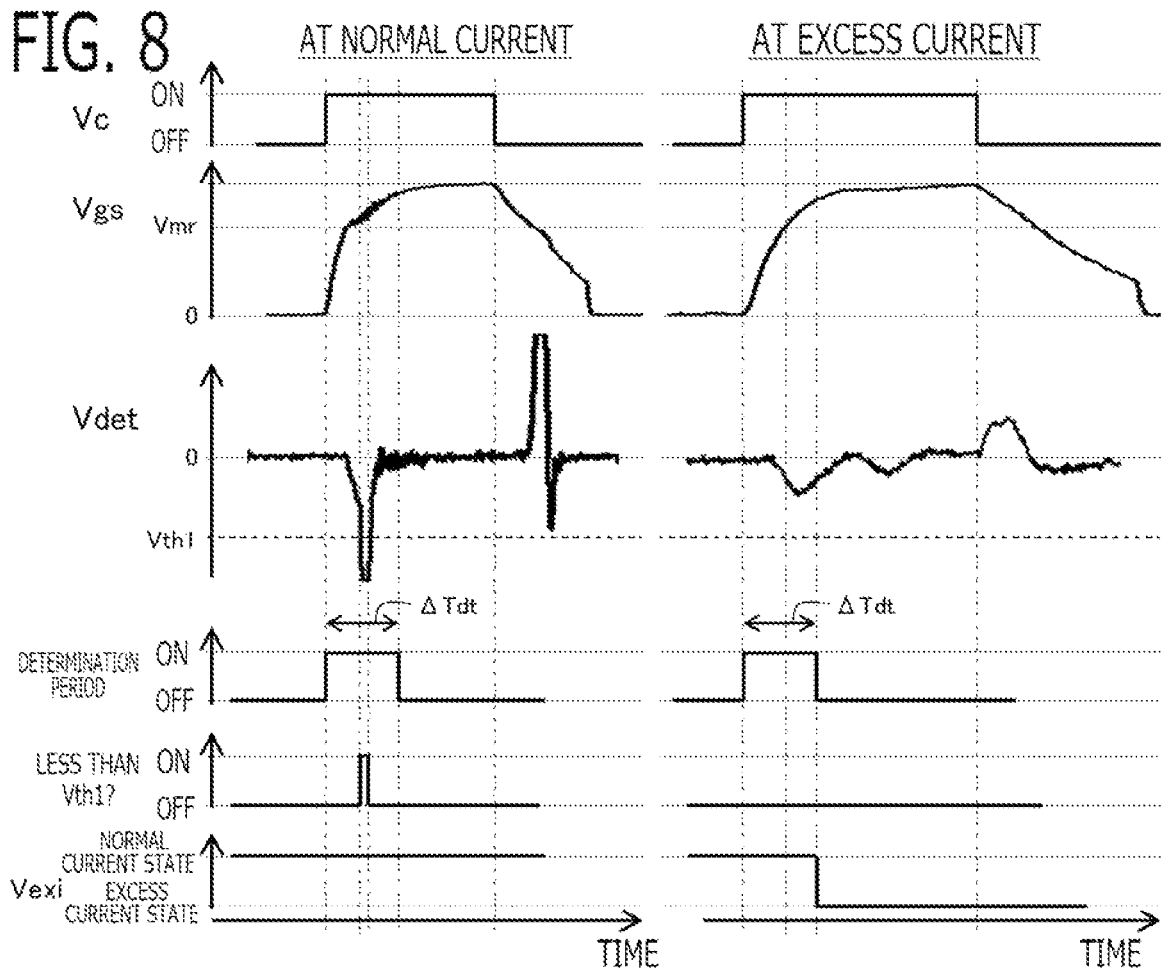
FIG. 8 is a time chart explaining the determination behavior of other embodiment at the time of the normal current and the excess current according to Embodiment 1.

As shown in the right side of FIG. 8, when, until a preliminarily determination period ΔTdt elapses after the driving voltage Vgs started to be set to ON state, the detection signal Vdet does not become less than the first threshold value Vth1, the excess current determination circuit 7 may determine that the excess current flows, and generate the excess current occurrence signal Vexi of the excess current state. As shown in the left side of FIG. 8, when, until the determination period ΔTdt elapses after the driving voltage Vgs started to be set to ON state, the detection signal Vdet becomes less than the first threshold value Vth1, the excess current determination circuit 7 may determine that the normal current flows, and generate the excess current occurrence signal Vexi of the normal current state.

As mentioned above, occurrence of the excess current can be determined by the time change rate dVds/dt of the main voltage Vds which decreases just after the driving voltage Vgs became ON state. Therefore, when, until the determination period ΔTdt elapses after the driving voltage Vgs started to be set to ON state, the detection signal Vdet does not become less than the first threshold value Vth1, it can be determined with good accuracy that the excess current flows. When, until the determination period ΔTdt elapses after the driving voltage Vgs started to be set to ON state, the detection signal Vdet becomes less than the first threshold value Vth1, it can be determined with good accuracy that the normal current flows. Therefore, when the determination period ΔTdt elapsed, the presence or absence of the occurrence of excess current can be determined in an early stage.

Since a period when the main voltage Vds is decreasing can be obtained previously at each of the excess current and the normal current, the determination period ΔTdt may be preliminarily set in accordance with a decreasing period of the main voltage Vds at the time of the excess current and a decreasing period of the main voltage Vds at the time of the normal current. The determination period ΔTdt may be set to an appropriate length which can perform early determination and is not too longer than both of the decreasing period at the time of the excess current, and the decreasing period at the time of the normal current.

<Second Other Embodiment of Excess Current Determination Circuit 7>

Figure 9:
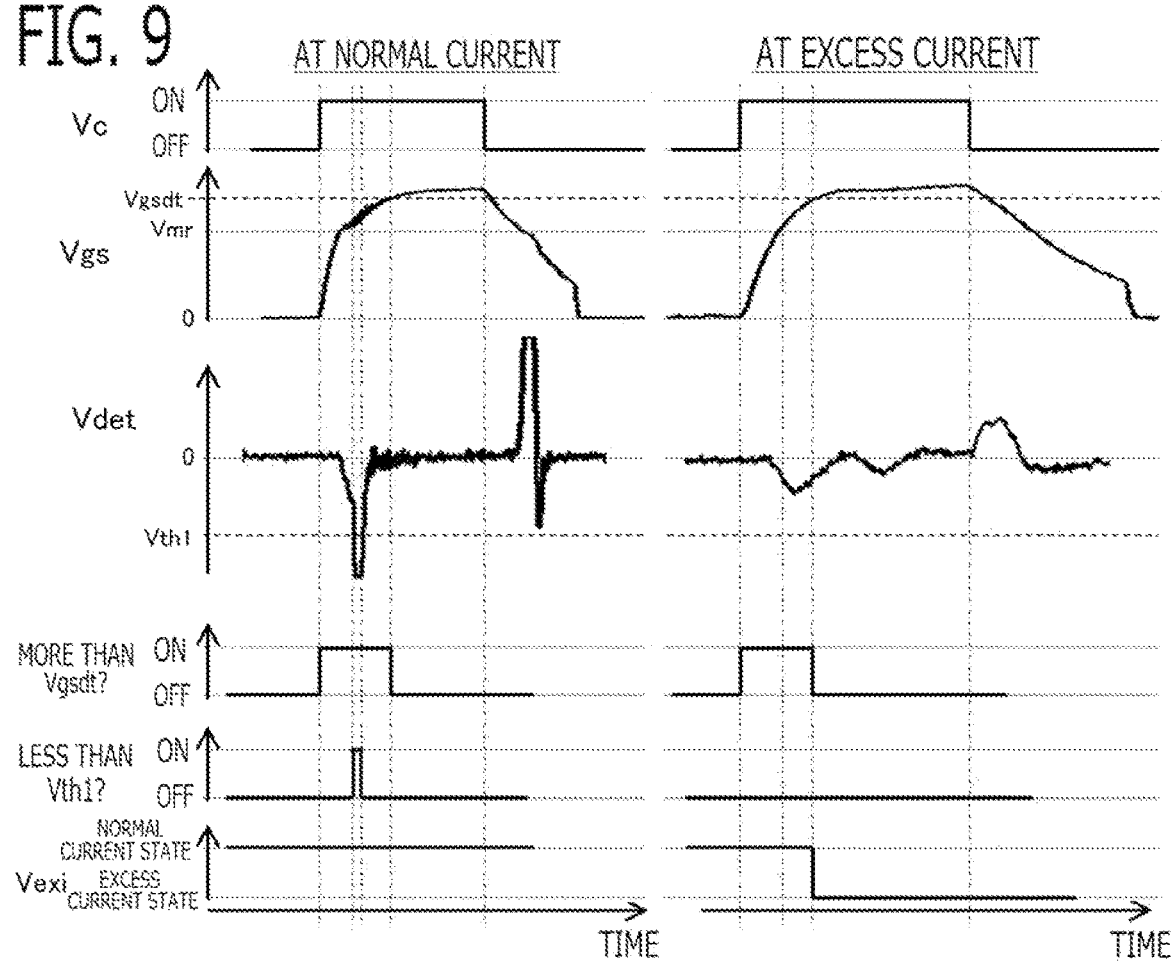
FIG. 9 is a time chart explaining the determination behavior of other embodiment at the time of the normal current and the excess current according to Embodiment 1.

Alternatively, as shown in the right side of FIG. 9, when, after the driving voltage Vgs starts to be set to ON state, the driving voltage Vgs exceeds a determination voltage Vgsdt without the detection signal Vdet being less than the first threshold value Vth1, the excess current determination circuit 7 may determine that the excess current flows, and generate the excess current occurrence signal Vexi of the excess current state. On the other hand, as shown in the left side of FIG. 9, when, in a state where the driving voltage Vgs is less than the determination voltage Vgsdt after the driving voltage Vgs starts to be set to ON state, the detection signal Vdet becomes less than the first threshold value Vth1, the excess current determination circuit 7 may determine that the normal current flows, and generate the excess current occurrence signal Vexi of the normal current state.

As explained using FIG. 3, during the mirror capacity on the drain terminal side is charged, the main voltage Vds decreases rapidly. When charge of the mirror capacity on the drain terminal side is completed, the decreasing speed of the main voltage Vds becomes slow, and the driving voltage Vgs increases to the prescribed power source voltage. Therefore, when the driving voltage Vgs becomes higher than the miller voltage Vmr, to some extent, which is the driving voltage Vgs when charge of the mirror capacity on the drain terminal side starts, it can be determined that charge of the mirror capacity on the drain terminal side was completed, and the decrease of the main voltage Vds for determining occurrence of the excess current was completed. Therefore, the determination voltage Vgsdt may be preliminarily set to a voltage which is higher than the miller voltage Vmr and lower than the power source voltage so as to correspond to the driving voltage Vgs at which the rapid decrease of the main voltage Vds ends.

According to this configuration, a period when the main voltage Vds is decreasing is determined by the behavior of the driving voltage Vgs, when the detection signal Vdet does not become less than the first threshold value Vth1 in the determined period, it can be determined with good accuracy that the excess current flows. When the detection signal Vdet becomes less than the first threshold value Vth1 in the determined period, it can be determined with good accuracy that the normal current flows. Therefore, when the period when the main voltage Vds is decreasing ends, the presence or absence of occurrence of the excess current can be determined in an early stage.

2. Embodiment 2

Figure 10:
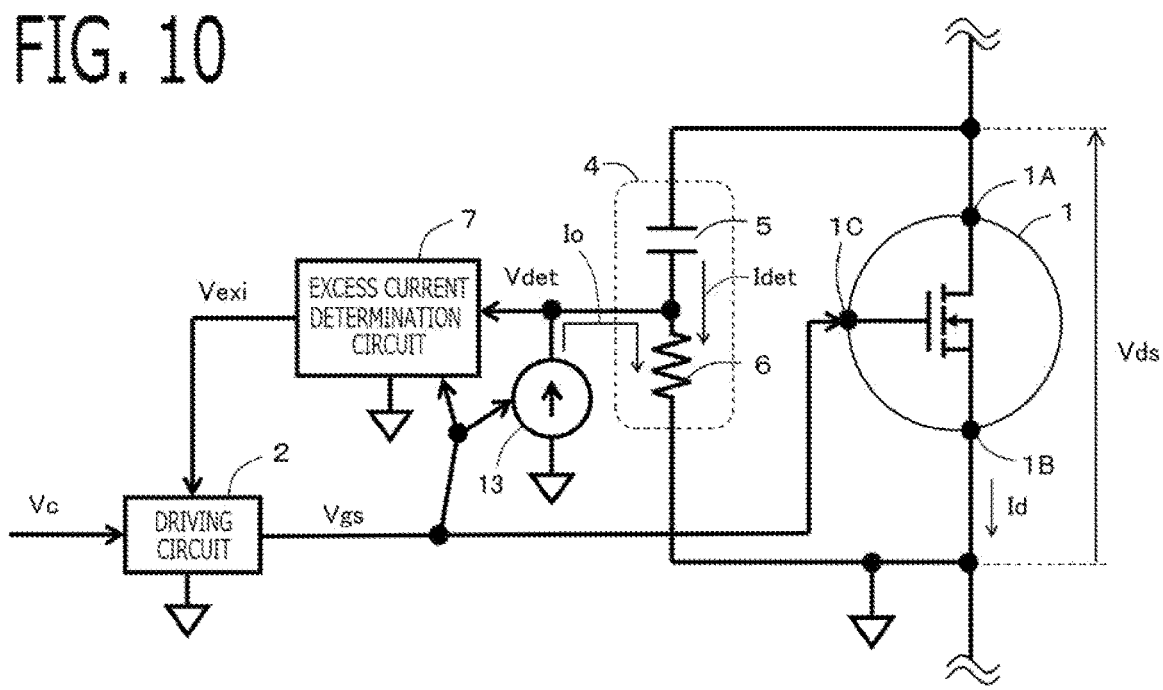
FIG. 10 is a schematic configuration diagram of the power converter according to Embodiment 2.

The power converter according to Embodiment 2 will be explained with reference to drawings. The explanation for constituent parts the same as those in Embodiment 1 will be omitted. The basic configuration of the power converter according to the present embodiment is the same as that of Embodiment 1. Embodiment 2 is different from Embodiment 1 in that a constant current source 13 is provided. FIG. 10 shows the schematic configuration diagram of the power converter according to the present embodiment.

Figure 11:
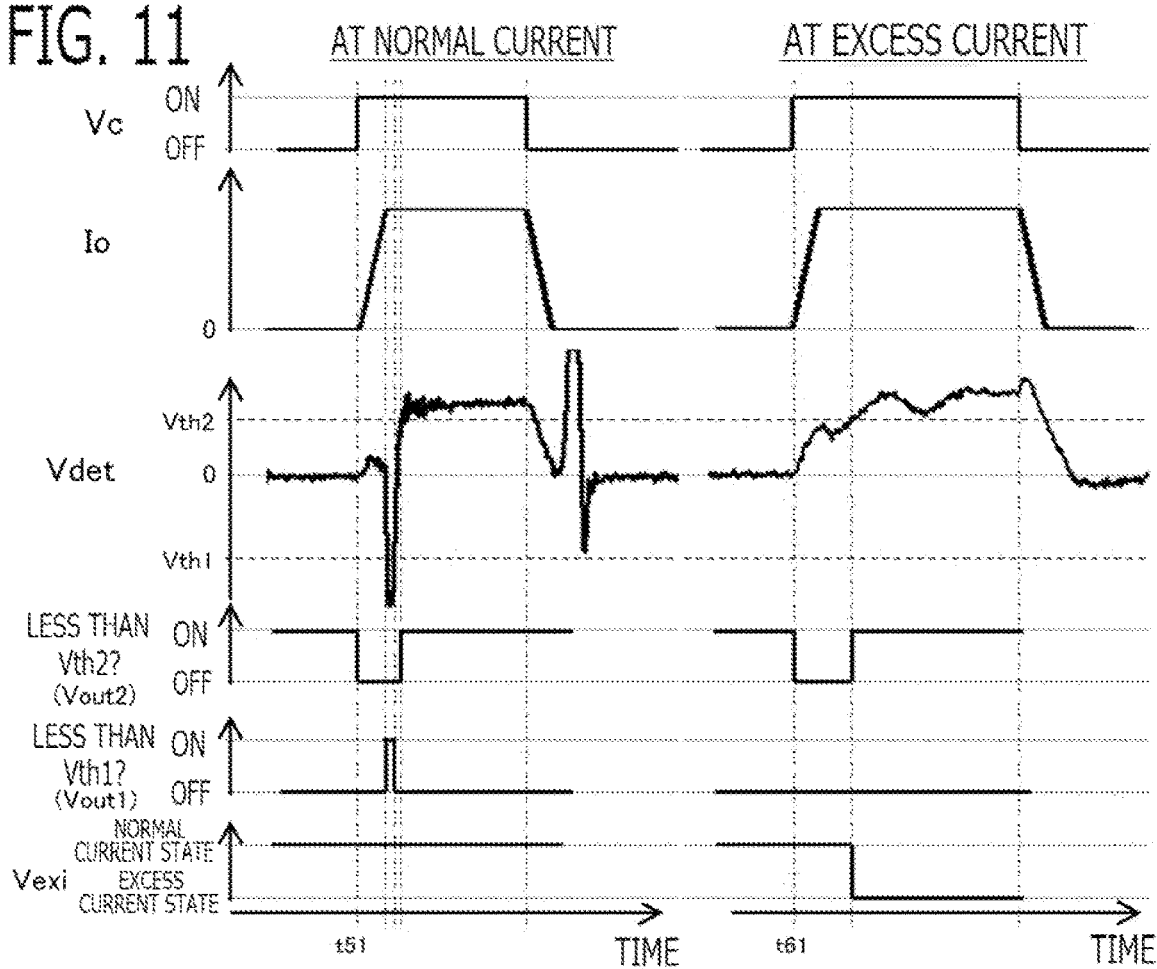
FIG. 11 is a time chart explaining the determination behavior at the time of the normal current and the excess current according to Embodiment 2.

The constant current source 13 is connected to a connection part between the capacity element 5 and the resistance element 6, and supplies a constant current Io to the connection part, when the driving voltage Vgs is set to ON state. The left side of FIG. 11 shows the behavior at the time of the normal current, and the right side of FIG. 11 shows the behavior at the time of the excess current. At the time t51 or the time t61, when the driving voltage Vgs starts to be set to ON state, the constant current source 13 starts to generate the constant current Io. When the constant current Io flows into the resistance element 6, as shown in the next equation, the detection signal Vdet becomes a value obtained by multiplying a resistance R of the resistance element 6 to a total current of the detection current Idet according to the time change rate dVds/dt of the main voltage which flows from the capacity element 5, and the constant current Io. Herein, the detection current Idet becomes a negative value during the main voltage Vds is decreasing, and the constant current Io becomes a positive value.

$$Vdet = R \times (Idet + Io) \quad (4)$$

A magnitude of the constant current Io is preliminarily set so that the minimum value of the detection signal Vdet in the determination period at the time of the normal current becomes smaller than 0 and the minimum value of the detection signal Vdet in the determination period at the time of the excess current becomes larger than 0.

Then, similar to Embodiment 1, when the detection signal Vdet is less than the first threshold value Vth1, the excess current determination circuit 7 determines that the normal current flows between the drain terminal 1A and the source terminal 1B, and generates the excess current occurrence signal Vexi of the normal current state showing occurrence of the normal current. When the detection signal Vdet is not less than the first threshold value Vth1, the excess current determination circuit 7 determines that the excess current flows between the drain terminal 1A and the source terminal 1B, and generates the excess current occurrence signal Vexi of the excess current state showing occurrence of the excess current. The excess current determination circuit 7 performs the determination, when the driving voltage Vgs is ON state.

Similar to Embodiment 1, when, after the driving voltage Vgs starts to be set to ON state and the detection signal Vdet becomes less than the second threshold value Vth2 which is a value higher than the first threshold value Vth1, the detection signal Vdet exceeds the second threshold value Vth2 without being less than the first threshold value Vth1, the excess current determination circuit 7 determines that excess current flows, and generates the excess current occurrence signal Vexi of the excess current state. On the other hand, when, in a state where the detection signal Vdet is less than the second threshold value Vth2 after the driving voltage Vgs starts to be set to ON state, the detection signal Vdet becomes less than the first threshold value Vth1, the excess current determination circuit 7 determines that the normal current flows, and generates the excess current occurrence signal Vexi of the normal current state. In the present embodiment, as shown in the next equation, the second threshold value Vth2 is larger than 0, and the first threshold value Vth1 is smaller than 0. The first threshold value Vth1 and the second threshold value Vth2 are preliminarily set together with setting of the constant current Io so that the excess current or the normal current can be determined appropriately.

$$Vth1 < 0 < Vth2 \quad (5)$$

In Embodiment 1, at the time of the excess current, when a gentle decrease of the main voltage Vds continues, a period until the detection signal Vdet exceeds the second threshold value Vth2 becomes comparatively long. On the other hand, in the present embodiment, at the time of the excess current, even when a gentle decrease of the main voltage Vds continues, the detection signal Vdet can be increased by the inflow of the constant current Io, and a period until the detection signal Vdet exceeds the second threshold value Vth2 can be shortened. And, in Embodiment 1, at the time of the excess current, when a gentle decrease of the main voltage Vds continues, the decrease amount of the detection signal Vdet becomes small, and the comparison with the second threshold value Vth2 becomes difficult. In the present embodiment, change of the detection signal Vdet by the inflow of the constant current Io can be added, and the comparison with the second threshold value Vth2 becomes easy. Therefore, at occurrence of the excess current, even when a gentle decrease of the main voltage Vds continues, occurrence of the excess current can be determined certainly in an early stage.

Even in the present embodiment, the excess current determination circuit 7 may be configured similar to the first other embodiment and the second other embodiment of Embodiment 1.

<Junction Capacitance of Diode>

Figure 12:
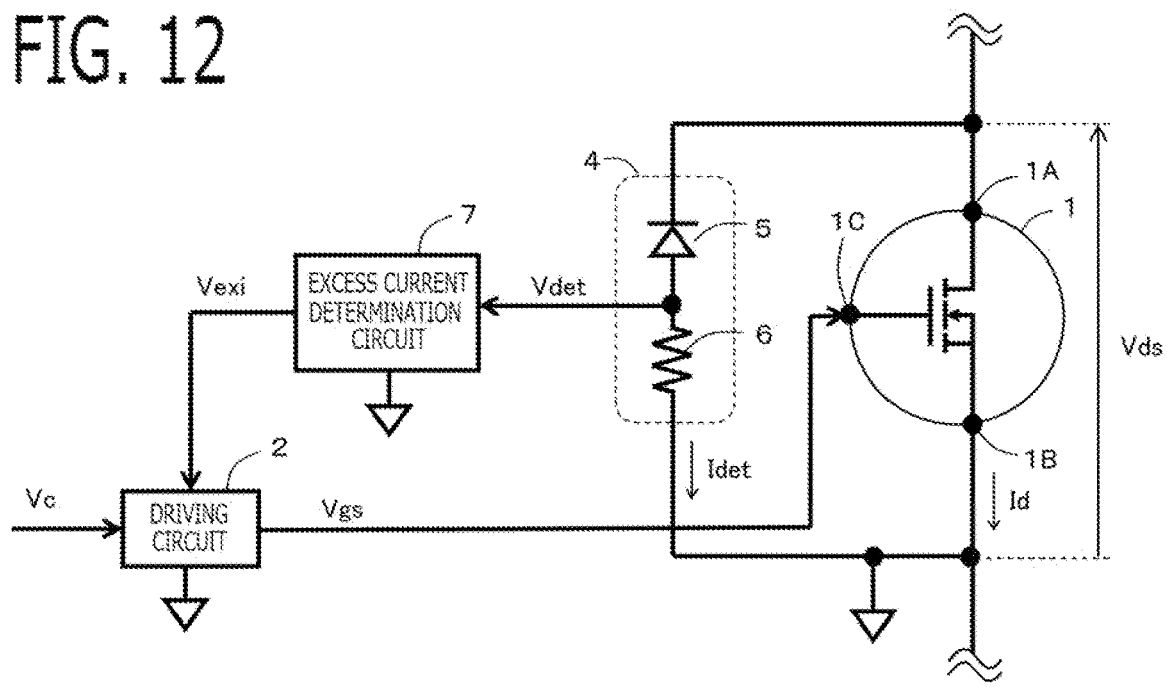
FIG. 12 is a schematic configuration diagram of the power converter according to other embodiment.

In each of embodiments, a junction capacitance of a diode may be used as the capacity element 5. The junction capacitance of the diode is a capacitance by a depletion layer of a junction boundary between a p-type semi-conductor and an N-type semiconductor. As shown in FIG. 12, a cathode of the diode 5 as the capacitance element 5 is connected to the drain terminal 1A, and an anode of the diode 5 is connected to one end of the resistance element 6. For example, although a surface mount type laminated ceramic capacitor which has a breakdown voltage of 1 kV class is difficult to obtain, a surface mount type diode which has a breakdown voltage of 1 kV class is available. It can be applied also to the power converter of high voltage.

<Wideband Gap Semiconductor>

In each of embodiments, as the semiconductor switching device 1, a switching device made of a wideband gap semiconductor may be used. The switching device made of the wideband gap semiconductor has a high breakdown voltage and a good heat dissipation, and fast switching is possible. Specifically, it is a semiconductor switching device, such as MOSFET, which uses SiC (silicon carbide) based material, GaN (gallium nitride) based material, or diamond based material. Although SiC-MOSFET can perform fast switching compared with the switching device made of the conventional Si (silicon) semiconductor, since the tolerance to the excess current is low, it is desired to determine occurrence of the excess current in an early stage. Therefore, when the switching device made of the wideband gap semiconductor is used, the power converter of present disclosure is preferred.

Although the present disclosure is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations to one or more of the embodiments. It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

What is claimed is:

1. A power converter comprising:
   a semiconductor switching device that is provided with a high potential side main electrode terminal, a low potential side main electrode terminal, and a control electrode terminal, and turns on and off an electrical connection between the high potential side main electrode terminal and the low potential side main electrode terminal according to a voltage applied to the control electrode terminal;
   a driving circuit that generates a driving voltage according to an inputted drive command signal, and applies the driving voltage to the control electrode terminal;
   a time change detection circuit that is connected between the high potential side main electrode terminal and the low potential side main electrode terminal, and outputs a detection signal according to a time change rate of a main voltage which is a potential difference of the high potential side main electrode terminal with respect to the low potential side main electrode terminal; and
   an excess current determination circuit that, when the detection signal is less than a first threshold value, determines that a normal current flows between the high potential side main electrode terminal and the low potential side main electrode terminal, and generates an excess current occurrence signal of a normal current state showing occurrence of the normal current; and when the detection signal is not less than the first threshold value, determines that an excess current flows between the high potential side main electrode terminal and the low potential side main electrode terminal, and generates the excess current occurrence signal of an excess current state showing occurrence of the excess current,
   wherein the driving circuit generates the driving voltage of OFF state, when the excess current occurrence signal is the excess current state, even when the drive command signal is ON state.

2. The power converter according to claim 1,
   wherein the time change detection circuit is provided with a differentiation circuit which outputs the detection signal obtained by time-differentiating the main voltage.

3. The power converter according to claim 2,
   wherein the differentiation circuit is configured by a capacity element and a resistance element which were connected in series between the high potential side main electrode terminal and the low potential side main electrode terminal.

4. The power converter according to claim 1,
   wherein when, after the detection signal becomes less than a second threshold value which is a value higher than the first threshold value, the detection signal exceeds the second threshold value without being less than the first threshold value, the excess current determination circuit determines that the excess current flows, and generates the excess current occurrence signal of the excess current state; and
   when, in a state where the detection signal is less than the second threshold value, the detection signal becomes less than the first threshold value, the excess current determination circuit determines that the normal current flows, and generates the excess current occurrence signal of the normal current state.

5. The power converter according to claim 1,
   wherein when, until a preliminarily set determination period elapses after the driving voltage started to be set to ON state, the detection signal does not become less than the first threshold value, the excess current determination circuit determines that the excess current flows, and generates the excess current occurrence signal of the excess current state; and
   When, until the determination period elapses after the driving voltage started to be set to ON state, the detection signal becomes less than the first threshold value, the excess current determination circuit determines that the normal current flows, and generates the excess current occurrence signal of the normal current state.

6. The power converter according to claim 1,
   wherein when, after the driving voltage starts to be set to ON state, the driving voltage exceeds a determination voltage without the detection signal being less than the first threshold value, the excess current determination circuit determines that the excess current flows, and generates the excess current occurrence signal of the excess current state; and
   when, after the driving voltage starts to be set to ON state, the detection signal becomes less than the first threshold value in a state where the driving voltage is less than the determination voltage, the excess current determination circuit determines that the normal current flows, and generates the excess current occurrence signal of the normal current state.

7. The power converter according to claim 1, wherein the driving circuit makes a change speed of changing the driving voltage from ON state to OFF state when the excess current occurrence signal becomes the excess current state slower than a change speed when the excess current occurrence signal is the normal current state.

8. The power converter according to claim 3, further comprising
a constant current source that is connected to a connection part between the capacity element and the resistance element, and supplies a constant current to the connection part when the driving voltage is set to ON state.

9. The power converter according to claim 3, wherein a junction capacitance of a diode is used as the capacity element.

10. The power converter according to claim 1, wherein the semiconductor switching device is a switching device made of a wideband gap semiconductor.

* * * * *